United States Patent
Choi et al.

(10) Patent No.: US 11,438,008 B2
(45) Date of Patent: Sep. 6, 2022

(54) SYSTEM AND BATTERY MANAGEMENT SYSTEM USING INCREMENTAL ADC

(71) Applicant: Silicon Works Co., Ltd., Daejeon (KR)

(72) Inventors: Ho Yul Choi, Daejeon (KR); Ju Pyo Hong, Daejeon (KR); Ho Jeong Jin, Daejeon (KR); Young Woon Ko, Daejeon (KR)

(73) Assignee: Silicon Works Co., Ltd, Daejeon (KR)

( * ) Notice: Subject to any disclaimer, the term of this patent is extended or adjusted under 35 U.S.C. 154(b) by 120 days.

(21) Appl. No.: 17/132,925

(22) Filed: Dec. 23, 2020

(65) Prior Publication Data

US 2021/0194496 A1 Jun. 24, 2021

(30) Foreign Application Priority Data

Dec. 24, 2019 (KR) ........................ 10-2019-0173694

(51) Int. Cl.
*H03M 3/00* (2006.01)
*H02J 7/00* (2006.01)

(52) U.S. Cl.
CPC ........... *H03M 3/494* (2013.01); *H02J 7/0013* (2013.01)

(58) Field of Classification Search
CPC .......... H03M 3/00; H03M 3/494; H03M 3/39; H03M 3/32; H03M 1/1295; H03M 1/124
See application file for complete search history.

(56) References Cited

U.S. PATENT DOCUMENTS

| 7,252,432 B1 * | 8/2007 | Henderson | G01K 1/026 |
| | | | 374/E1.005 |
| 10,541,706 B2 * | 1/2020 | Erol | H03M 3/46 |
| 2013/0229293 A1 * | 9/2013 | Standley | H03M 1/002 |
| | | | 341/137 |

FOREIGN PATENT DOCUMENTS

| KR | 1991-0021044 A | 6/1992 |
| KR | 2000-0010858 B1 | 2/2000 |
| KR | 10-0804645 A1 | 2/2008 |
| KR | 10-1466476 B1 | 12/2014 |
| KR | 2018-0028227 B1 | 3/2018 |

* cited by examiner

*Primary Examiner* — Lam T Mai
(74) *Attorney, Agent, or Firm* — Polsinelli PC

(57) ABSTRACT

Disclosed are a system and a battery management integration circuit using an incremental analog-to-digital converter (ADC), which can reduce the consumption of the amount of a bias current. The system includes an incremental ADC configured to perform accumulation on an analog signal during an oversampling period and a bias current generator configured to provide a bias current for the accumulation of the incremental ADC. The bias current generator provides a first amount of the bias current in a first period defined from start timing of oversampling to preset timing during the oversampling period, and provides a second amount of the bias current, smaller than the first amount of the bias current, in a second period subsequent to the first period.

13 Claims, 2 Drawing Sheets

SYSTEM AND BATTERY MANAGEMENT SYSTEM USING INCREMENTAL ADC

BACKGROUND

1. Technical Field

The present disclosure relates to a system using an incremental delta-sigma analog-to-digital converter (hereinafter referred to as an "incremental ADC"), and more particularly, to a system and a battery management integration circuit using an incremental ADC, which can reduce the consumption of the amount of a bias current.

2. Related Art

An incremental ADC is for calculating values of an increment and a decrement using a preset delta value in a process of sampling an analog input. It may be understood that a difference between a sampling width and a previously converted output value corresponds to a delta value and recorded values of an increment and a decrement correspond to a sigma value, that is, an output value.

The incremental ADC is used to convert an analog input into a digital value in various fields, such as a battery management system.

The incremental ADC uses a bias current having a given level during an oversampling period.

Furthermore, a peripheral circuit for driving the incremental ADC or the front-end for an analog input also uses a bias current having a given level.

Accordingly, a system, such as a battery management system using the incremental ADC, has low energy consumption efficiency.

Recently, energy consumption efficiency is recognized as an important factor for evaluating performance of a system.

Accordingly, a system using the incremental ADC needs to be designed to improve energy consumption efficiency.

SUMMARY

Various embodiments are directed to enabling a system using an incremental ADC to have high energy consumption efficiency by reducing the amount of a bias current used.

Also, various embodiments are directed to enabling a battery management system using an incremental ADC to have high energy consumption efficiency by reducing the amount of a bias current used.

In an embodiment, a system using an increment ADC may include an incremental ADC configured to perform accumulation on an analog signal during an oversampling period and a bias current generator configured to provide a bias current for the accumulation of the incremental ADC. The bias current generator provides a first amount of the bias current in a first period defined from start timing of oversampling to preset timing during the oversampling period, and provides a second amount of the bias current, smaller than the first amount of the bias current, in a second period subsequent to the first period.

In an embodiment, a battery management system may include an incremental ADC configured to perform accumulation on an analog signal during an oversampling period, an analog front-end configured to receive a measured analog input of an external battery cell array and provide the incremental ADC with the analog signal corresponding to the analog input, and a bias current generator configured to provide a bias current for the accumulation of the incremental ADC. The bias current generator provides a first amount of the bias current in a first period defined from start timing of oversampling to preset timing during the oversampling period, and provides a second amount of the bias current, smaller than the first amount of the bias current, in a second period subsequent to the first period.

DETAILED DESCRIPTION

Figure 1:
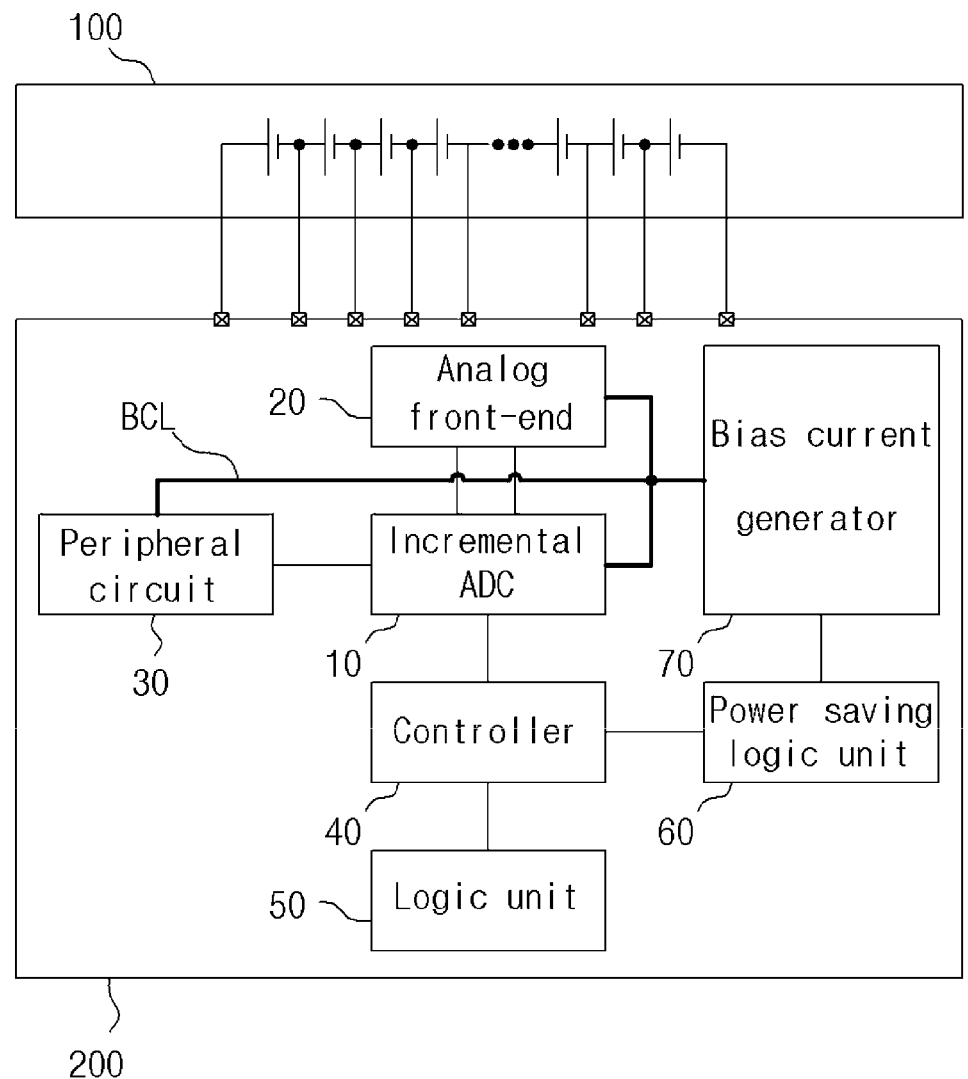
FIG. 1 is a block diagram illustrating a preferred embodiment of a battery management system, that is, an example of a system using an incremental ADC according to an embodiment of the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

According to an embodiment of the present disclosure, in order to reduce the amount of a bias current used in a system using an incremental ADC, the system is configured to divide an oversampling period into a plurality of periods based on cumulative weight and to reduce the amount of a bias current supplied in a period in which the cumulative weight is small. In this case, the cumulative weight may be understood as a ratio occupied by a value accumulated during the oversampling period. The great cumulative weight may be understood as the high ratio occupied by the accumulated value and the small cumulative weight may be understood as the low ratio occupied by the accumulated value.

FIG. 1 illustrates a battery management system, that is, an example of a system using an incremental ADC.

The battery management system includes a battery cell array 100 and a battery management integration circuit 200.

The battery management integration circuit 200 is configured to measure a cell current, cell voltage and cell temperature of the battery cell array 100 and to output the results of the measurement as digital values.

To this end, the battery management integration circuit 200 includes an incremental ADC 10, an analog front-end 20, a peripheral circuit 30, a controller 40, a logic unit 50, a power saving logic unit 60, and a bias current generator 70.

In the configuration, it has been illustrated the bias current generator 70 is configured to provide a bias current to the incremental ADC 10, the analog front-end 20, and the peripheral circuit 30 through a bias current supply line BCL.

The analog front-end 20 is configured to receive a measured analog input of the external battery cell array 100 and to provide the incremental ADC 10 with an analog signal corresponding to the analog input.

The analog front-end 20 may include various blocks for measuring measurement elements of the battery cell array 100, such as a cell current measurement block (not illustrated), a cell voltage measurement block (not illustrated), and a cell temperature measurement block (not illustrated).

The analog front-end 20 may include parts, such as a buffer for amplifying or transmitting a measured analog input. A bias current for driving the parts may be supplied to the parts through the bias current supply line BCL.

The peripheral circuit 30 is electrically coupled to the incremental ADC 10 for an operation of the incremental ADC 10.

The peripheral circuit 30 is for providing a voltage necessary for an operation of the incremental ADC 10, such as a bandgap reference voltage. To this end, the peripheral circuit 30 may include various parts, such as a circuit for generating the bandgap reference voltage or a buffer for providing a generated voltage. A bias current for driving the various parts may be supplied to the various parts through the bias current supply line BCL.

The incremental ADC 10 is configured to receive an analog signal from the analog front-end 20, perform accumulation on the analog signal during an oversampling period, and provide the controller 40 with a digital value obtained as a result of the accumulation.

The incremental ADC 10 is configured to calculate values of an increment and a decrement using a preset delta value during an oversampling period. To this end, the incremental ADC 10 is supplied with a bias current through the bias current supply line BCL.

The controller 40, the logic unit 50, and the power saving logic unit 70 are digital parts. Accordingly, a bias current does not need to be supplied to the controller 40, the logic unit 50, and the power saving logic unit 70.

The controller 40 is configured to control operations of the incremental ADC 10 and the power saving logic unit 60 and to transmit a digital value of the incremental ADC 10 to the logic unit 50.

The controller 40 may control the oversampling of the incremental ADC 10 by providing the incremental ADC 10 with a system clock SC capable of determining an oversampling period and a clock CLK for counting an increment.

The logic unit 50 may be configured to include digital logic for various purposes, such as an application for performing a process using a digital value provided by the controller 40 or an application for providing the outside with a value corresponding to the results of performing the process using the digital value.

The power saving logic unit 60 is configured to receive a control signal for power saving from the controller 40 and to control the generation of a bias current by the bias current generator 70 in response to the control signal.

The power saving logic unit 60 may control the amount of a bias current, provided by the bias current generator 70, stage by stage for each preset period, in synchronization with the clock CLK of the controller 10 for controlling the oversampling of the incremental ADC 10, under the control of the controller 40.

The power saving logic unit 60 may divide, based on the clock CLK, an oversampling period into a first period, defined form start timing of oversampling to preset timing, and a second period subsequent to the first period, and may control an operation of the bias current generator 70. Furthermore, the power saving logic unit 60 may additionally divide the second period into two or more third periods, and may control an operation of the bias current generator 70.

In this case, the first period may be set to ½ or more of the oversampling period. Each of the third periods may be set to ¼ or less of the oversampling period. In an embodiment of the present disclosure, it is illustrated that the first period is set to ½ of the oversampling period and each of the third periods is set to ¼ of the oversampling period.

Furthermore, the power saving logic unit 60 may be configured to control the amount of a bias current generated by the bias current generator 70. In this case, the power saving logic unit 60 may control the amount of a bias current, generated and provided by the bias current generator 70, to be smaller in the second period than in the first period. Furthermore, the power saving logic unit 60 may control the bias current generator 70 to generate and provide a smaller amount of a bias current in a later period of the third periods of the second period.

The bias current generator 70 is configured to provide a bias current to the incremental ADC 10, the analog front-end 20, and the peripheral circuit 30, that is, analog parts, through the bias current supply line BCL.

The bias current generator 70 may provide the same amount of a bias current to the incremental ADC 10, the analog front-end 20, and the peripheral circuit 30, that is, analog parts.

The bias current generator 70 generates and provides a bias current under the control of the power saving logic unit 60.

Accordingly, the bias current generator 70 may provide a first amount of a bias current in a first period defined from start timing of oversampling to preset timing during an oversampling period, and may provide a second amount of the bias current, smaller than the first amount of the bias current, in a second period subsequent to the first period.

Figure 2:
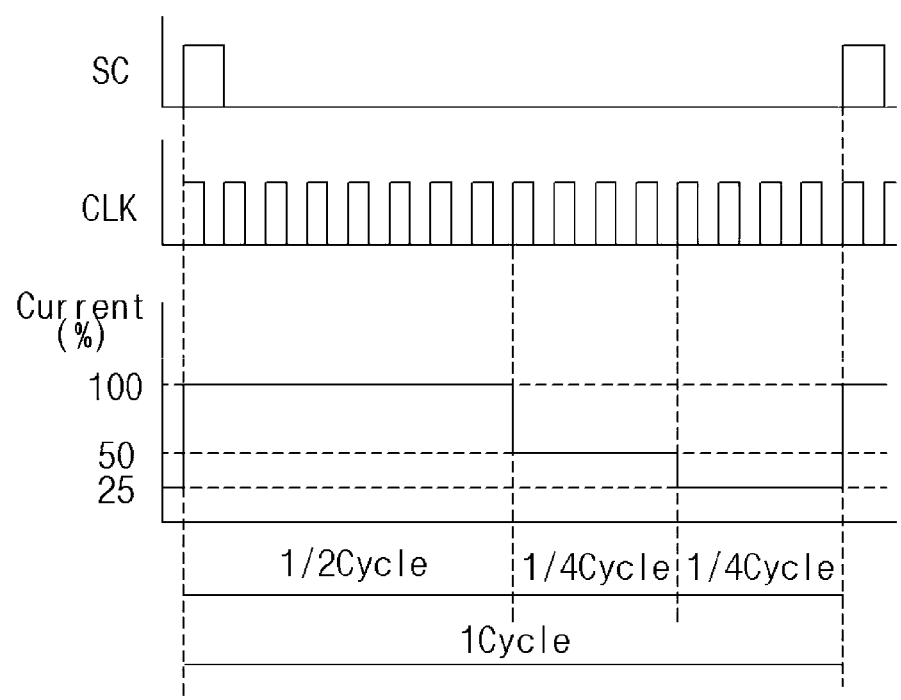
FIG. 2 is a waveform diagram for describing an operation of the battery management system of FIG. 1.

Referring to FIG. 2, an oversampling period may be defined by the system clock SC. A plurality of clocks CLK is provided for counting during the oversampling period defined by the system clock SC.

FIG. 2 illustrates that a first period is set to ½ (½ cycle) of the oversampling period and each of third periods is set to ¼ (¼ cycle) of the oversampling period.

In the case of the incremental ADC 10, cumulative weight in which results accumulated in a front part, that is, the first period, affect total cumulative results during the oversampling period is great. Cumulative weight in which results accumulated after the first period affect the total cumulative results during the oversampling period is small.

An embodiment of the present disclosure is configured to reduce consumption of a bias current while obtaining the results of accumulation within a range permitted in the battery management system, by considering the cumulative weight and to provide the amount of a bias current reduced stage by stage, in the first period in which the cumulative weight is great and the third periods subsequent to the first period.

That is, for example, the bias current generator 70 is configured to provide a bias current having the amount of current of 100% in the first period, and to provide the bias currents, having the amounts of current reduced to 50% and 25% stage by stage, in the third periods subsequent to the first period.

According to the embodiment, current consumption can be significantly reduced compared to a case where the bias current generator 70 provides a bias current of 100% during the oversampling period.

In an embodiment of the present disclosure, the bias current generator 70 can also reduce the amount of a bias current, supplied to the analog front-end 20 and the peripheral circuit 30, stage by stage, in addition to the incremental ADC 10, in the first period and the third periods, as in FIG. 2.

As described above, the present disclosure is configured to divide the oversampling period of the incremental ADC 10 into a period, which is defined from start timing of oversampling to given time and in which cumulative weight is great, and a period, which is subsequent to the period in which the cumulative weight is great and in which the cumulative weight is small, and to provide a bias current having a lower level as the cumulative weight becomes smaller.

Accordingly, if the present disclosure is applied to a system using the incremental ADC in addition to the battery management system of FIG. 1, the amount of a bias current used in a period in which cumulative weight becomes smaller during an oversampling period can be reduced. As a result, a total amount of a bias current used during the oversampling period can be reduced.

Accordingly, according to an embodiment of the present disclosure, energy consumption efficiency of a system using an incremental ADC, such as the battery management system, can be improved.

According to an embodiment of the present disclosure, the oversampling period of the incremental ADC is divided into a period, which is defined from start timing of oversampling to given time and in which cumulative weight is great, and a period, which is subsequent to the period in which the cumulative weight is great and in which the cumulative weight is small. A bias current having a lower level is provided in a period in which the cumulative weight is smaller.

Accordingly, in a system using the incremental ADC, such as the battery management system, a total amount of a bias current used during an oversampling period can be reduced because the amount of the bias current used in a period in which cumulative weight is smaller during the oversampling period is reduced.

Accordingly, energy consumption efficiency of a system using the incremental ADC, such as the battery management system, can be improved.

While various embodiments have been described above, it will be understood to those skilled in the art that the embodiments described are by way of example only. Accordingly, the disclosure described herein should not be limited based on the described embodiments.

What is claimed is:

1. A system using an incremental analog-to-digital converter (ADC), comprising:
   an incremental ADC configured to perform accumulation on an analog signal during an oversampling period; and
   a bias current generator configured to provide a bias current for the accumulation of the incremental ADC,
   wherein the bias current generator provides a first amount of the bias current in a first period defined from start timing of oversampling to preset timing during the oversampling period, and provides a second amount of the bias current, smaller than the first amount of the bias current, in a second period subsequent to the first period.

2. The system of claim 1, wherein the first period is set to ½ or more of the oversampling period.

3. The system of claim 1, wherein:
   the second period is divided into two or more third periods, and
   the bias current generator provides the bias current, having an amount of current reduced stage by stage, in the third periods.

4. The system of claim 1, wherein:
   the second period is divided into two third periods each set to ¼ of the oversampling period, and
   the bias current generator provides the bias current, having an amount of current reduced stage by stage, in the third periods.

5. The system of claim 1, further comprising at least one of:
   an analog front-end configured to provide the incremental ADC with the analog signal corresponding to an analog input received from the outside; and
   a peripheral circuit electrically coupled to the incremental ADC for an operation of the incremental ADC,
   wherein the bias current generator provides the bias current to at least one of the analog front-end and the peripheral circuit, the bias current having an amount of current identical with an amount of current provided to the incremental ADC.

6. The system of claim 1, further comprising:
   a controller configured to control the oversampling of the incremental ADC; and
   a power saving logic unit configured to control the bias current generator in response to a control signal of the controller,
   wherein the power saving logic unit controls an amount of the bias current, provided by the bias current generator, stage by stage for each period, in synchronization with a clock of the controller for controlling the oversampling of the incremental ADC, under a control of the controller.

7. A battery management system comprising:
   an incremental analog-to-digital converter (ADC) configured to perform accumulation on an analog signal during an oversampling period;
   an analog front-end configured to receive a measured analog input of an external battery cell array and provide the incremental ADC with the analog signal corresponding to the analog input; and
   a bias current generator configured to provide a bias current for the accumulation of the incremental ADC,
   wherein the bias current generator provides a first amount of the bias current in a first period defined from start timing of oversampling to preset timing during the oversampling period, and provides a second amount of the bias current, smaller than the first amount of the bias current, in a second period subsequent to the first period.

8. The battery management system of claim 7, wherein the first period is set to ½ or more of the oversampling period.

9. The battery management system of claim 7, wherein:
   the second period is divided into two or more third periods, and
   the bias current generator provides the bias current, having an amount of current reduced stage by stage, in the third periods.

10. The battery management system of claim 7, wherein:
    the second period is divided into two third periods each set to ¼ of the oversampling period, and
    the bias current generator provides the bias current, having an amount of current reduced stage by stage, in the third periods.

11. The battery management system of claim 7, wherein the bias current generator provides the bias current to the analog front-end, the bias current having an amount of current identical with an amount of current provided to the incremental ADC.

12. The battery management system of claim 7, further comprising a peripheral circuit electrically coupled to the incremental ADC for an operation of the incremental ADC, wherein the bias current generator provides the bias current to the peripheral circuit, the bias current having an amount of current identical with an amount of current provided to the incremental ADC.

13. The battery management system of claim 7, further comprising:
   a controller configured to control the oversampling of the incremental ADC; and
   a power saving logic unit configured to control the bias current generator in response to a control signal of the controller,
   wherein the power saving logic unit controls an amount of the bias current, provided by the bias current generator, stage by stage for each period, in synchronization with a clock of the controller for controlling the oversampling of the incremental ADC, under a control of the controller.

\* \* \* \* \*